(12) United States Patent
Abdul-Latif et al.

(10) Patent No.: US 9,356,599 B1
(45) Date of Patent: May 31, 2016

(54) DIFFERENTIAL DRIVER CIRCUIT HAVING BIAS EQUALIZING PRE-DRIVERS

(71) Applicant: BROADCOM CORPORATION, Irvine, CA (US)

(72) Inventors: Mohammed Mohsen Abdul-Salam Abdul-Latif, Irvine, CA (US); Wei Zhang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/586,451

(22) Filed: Dec. 30, 2014

Related U.S. Application Data

(60) Provisional application No. 62/083,468, filed on Nov. 24, 2014.

(51) Int. Cl.
*H03B 1/00* (2006.01)
*H03K 3/00* (2006.01)
*H03K 19/0185* (2006.01)

(52) U.S. Cl.
CPC .............................. *H03K 19/018514* (2013.01)

(58) Field of Classification Search
CPC ................... H03K 19/00361; H03K 19/00315; H03K 19/0013; H04L 25/028; H04L 25/0272
USPC ......... 327/108–112, 170–176, 427, 434, 437, 327/378–384; 326/82, 83, 87
See application file for complete search history.

(56) References Cited

U.S. PATENT DOCUMENTS

| | | | | |
|---|---|---|---|---|
| 6,720,805 B1 * | 4/2004 | Haas | ................... | H03F 3/45183 326/83 |
| 8,466,982 B2 * | 6/2013 | Liu | .......................... | G05F 1/56 327/108 |
| 2013/0194005 A1 * | 8/2013 | Voutilainen | ......... | H04L 25/0272 327/108 |

* cited by examiner

*Primary Examiner* — Lincoln Donovan
*Assistant Examiner* — Thomas Skibinski
(74) *Attorney, Agent, or Firm* — Garlick & Markison; Bruce E. Garlick

(57) ABSTRACT

A differential driver circuit includes a differential driver configured to drive an output signal based upon a positive leg pull up signal, a positive leg pull down signal, a negative leg pull up signal, and a negative leg pull down signal. A first pre-driver includes a first driver configured to receive a positive leg signal and a first voltage divider coupled to an output of the first driver and configured to produce the first pull up signal and the first pull down signal. A second pre-driver includes a second driver configured to receive a negative leg signal and a second voltage divider coupled to an output of the second driver and configured to produce the second pull up signal and the second pull down signal. The differential driver may include a positive leg and a negative leg, each having a pull up transistor and a pull down transistor.

20 Claims, 7 Drawing Sheets

500

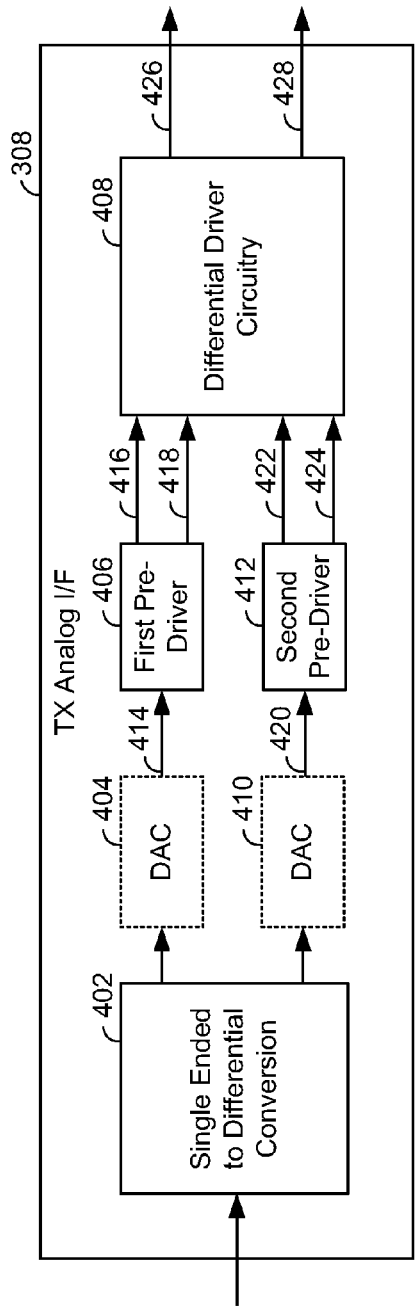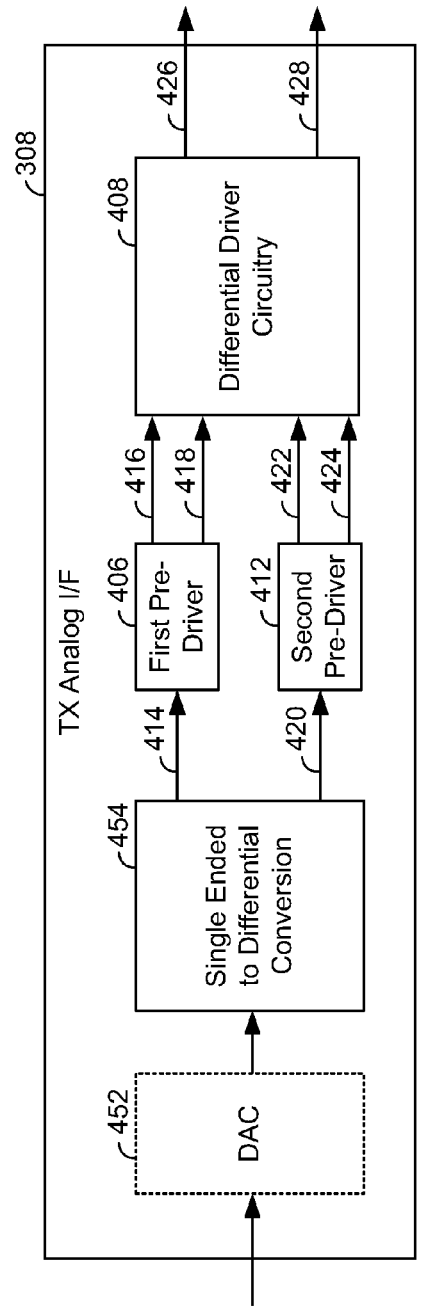

DIFFERENTIAL DRIVER CIRCUIT HAVING BIAS EQUALIZING PRE-DRIVERS

CROSS REFERENCE TO RELATED PATENTS/PATENT APPLICATIONS

Provisional Priority Claim, 35 U.S.C. §119(e)

The present U.S. Utility Patent Application claims priority pursuant to 35 U.S.C. §119(e) to U.S. Provisional Application No. 62/083,468, entitled "Differential Driver Circuit," filed Nov. 24, 2014, which is hereby incorporated herein by reference in its entirety and made part of the present U.S. Utility Patent Application for all purposes.

STATEMENT REGARDING FEDERALLY SPONSORED RESEARCH OR DEVELOPMENT

Not applicable

INCORPORATION-BY-REFERENCE OF MATERIAL SUBMITTED ON A COMPACT DISC

Not applicable

BACKGROUND

1. Technical Field

This disclosure relates generally to communications and more particularly to driver circuitry for use in a communication device.

2. Description of Related Art

Communication systems are well known and include wireless networks, wired networks, satellite networks, and various other types of networks. Wired networks use wiring or fiber to direct communications between communication devices while wireless networks support communications wirelessly. As communications technology has advanced, integrated circuits have been developed that service both wired and wireless communications. While these "combination" integrated circuits reduce the integrated circuit count of communication devices and the cost of such devices, such integration causes problems.

Line drivers are amplification devices that service wired links for various types of digital interfaces such as Serializer/Deserializer (SERDES) and optical links, for example. These line drivers drive serialized bit stream traffic from transmitters to receivers. In many transmitter/receiver links, the bit stream traffic is constructed differentially, i.e., positive and negative legs, to reduce common mode back plane noise. Common mode back plane noise is particularly troublesome in ICs that service both wired and wireless communications because the common mode noise can result in Electromagnetic Interference (EMI) that interferes with serviced wireless communications.

With differential bit stream signals, as the positive leg transitions from logic low to logic high, the negative leg transitions from logic high to logic low. Likewise, as the negative leg transitions from logic low to logic high, the positive leg transitions from logic high to logic low. Most differential line drivers include pull up and pull down transistors in both positive and negative legs. Because the pull up and pull down transistors in each of the positive and negative legs are biased differently, the rise times of each leg differ from the fall times of each leg. This difference between rise and fall times of the differential signals causes common mode back plane noise, resulting in undesirable EMI.

BRIEF DESCRIPTION OF THE SEVERAL VIEWS OF THE DRAWING(S)

FIG. 4A is a block diagram illustrating an analog interface of a wired interface of a communication device constructed operating according to one or more embodiments of the present disclosure;

FIG. 4B is a block diagram illustrating an analog interface of a wired interface of a communication device constructed operating according to one or more embodiments of the present disclosure;

DETAILED DESCRIPTION OF THE DISCLOSURE

Figure 1:
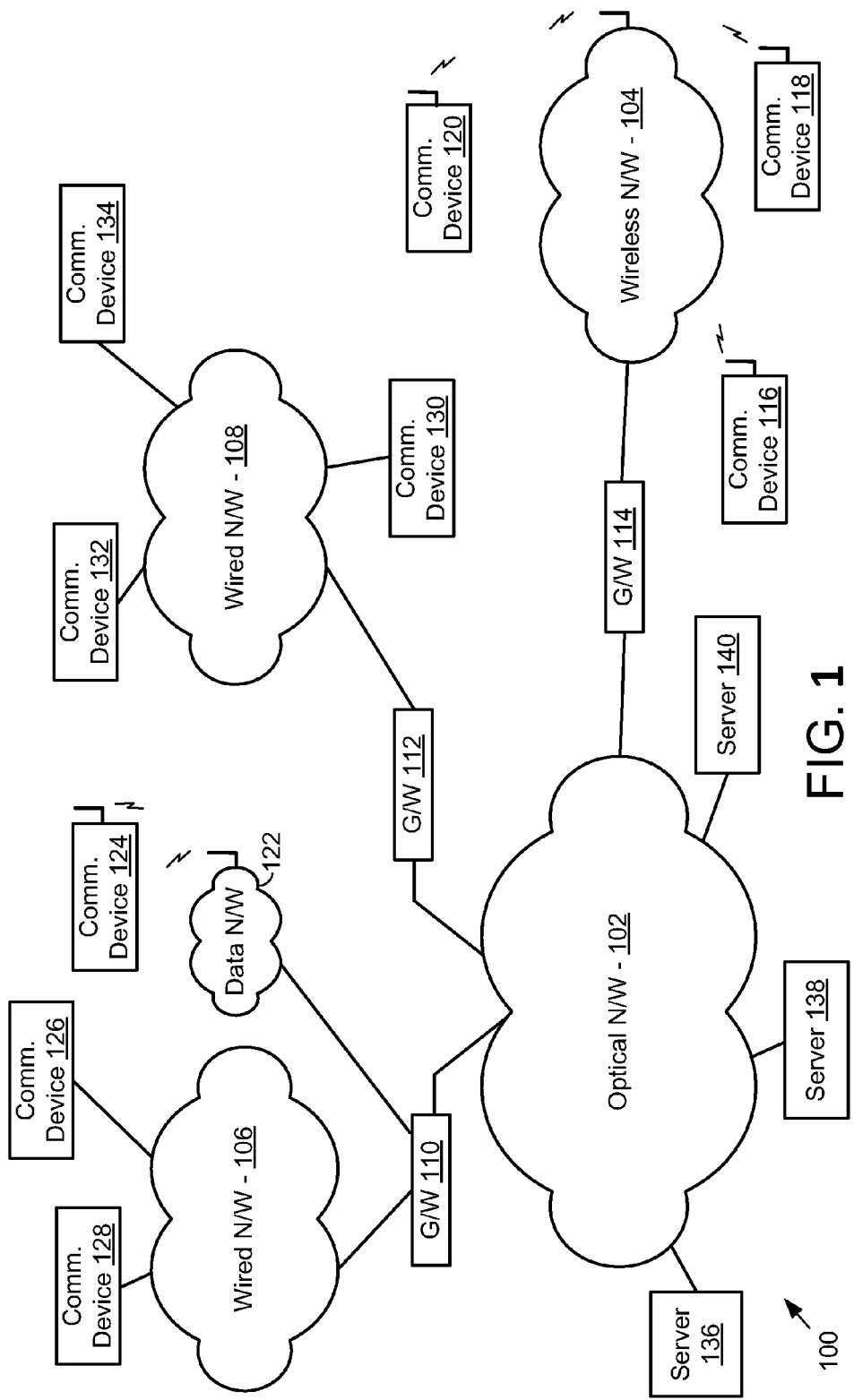
FIG. 1 is a system diagram illustrating a communication system having one or more communication devices constructed and operating according to one or more embodiments of the present disclosure.

FIG. 1 is a system diagram illustrating a communication system 100 having one or more communication devices constructed and operating according to one or more embodiments of the present disclosure. The communication system 100 includes a communication infrastructure that services a plurality of communication devices. The communication infrastructure includes an optical network 102, a wireless network 104, a wired network 106, and a wired network 108. These networks provide a backbone for servicing communications among a plurality of communication devices. The optical network 102 includes optical network components and may also include wired networking components. It operates according to one or more communication standards. Coupled to the optical network are servers 136, 138, and 140, which service various types of communications and/or transactions, e.g., media services, financial transactions, searching, and/or other commerce. Gateways bridge the networks 102, 104, 106 and 108.

Gateway 114 bridges communications between optical network 102 and wireless network 104, gateway 110 bridges communications between optical network 102 and wired network 106, and gateway 112 bridges communications between optical network and wired network 108.

Wireless network 104 may be a cellular network, a Wireless Wide Area Network (WWAN), a Wireless Local Area Network (WLAN), a Wireless Personal Area Network (WPAN), a Near Field Communication (NFC) network, a 60 GHz network, or a combination of these. The wireless network 104 supports one or more wireless communication protocols, e.g., IEEE 802.11x, GSM, EDGE, LTE, and/or other wireless communication protocols. The wireless network 104 supports communication devices 116, 118, and 120. These communication devices 116, 118, and 120 may be cell phones, laptop computers, desktop computers, tablet computers, data terminals, or other computing devices that support wireless communications and that may service wired communications.

Wired networks 106 and 108 may be Local Area Networks (LANs), Wide Area Networks (WANs), cable networks, other types of wired networks, and/or a combination of these. Wired network 106 supports standardize wired communications and services communication devices 126 and 128. Wired network 108 supports communication devices 130, 132 and 134. These communication devices 126, 128, 130, 132, and 134 may be computers, home entertainment components, televisions, home gateways, and/or other types of devices that support wired communications (and wireless communications). Wired networks 106 may also support a coupled wireless data network 122, such as a WLAN, a WWAN, a Near Field Communication network, a 60 GHz network, and/or another type of wireless network. The wireless data network 122 supports communication device 124.

One or more of the communication devices illustrated in FIG. 1 supports both wired and wireless communications. In supporting the wired communications one or more of the communication devices supports bit stream communications, which may be differential bit stream communications. These communication devices include differential driver circuitry constructed and/or operating according to the present disclosure. Such differential driver circuitry, which is described further herein, provides improved performance as compared to prior differential driver circuitry. The differential driver circuitry may support one or both of wired communications with wired network 106 and 108 and optical communications with optical network 102. Such differential driver circuitry may also be incorporated into components of one or more of optical network 102 and wired networks 106 and 108 and/or gateways 110, 112 and 114.

Figure 2:
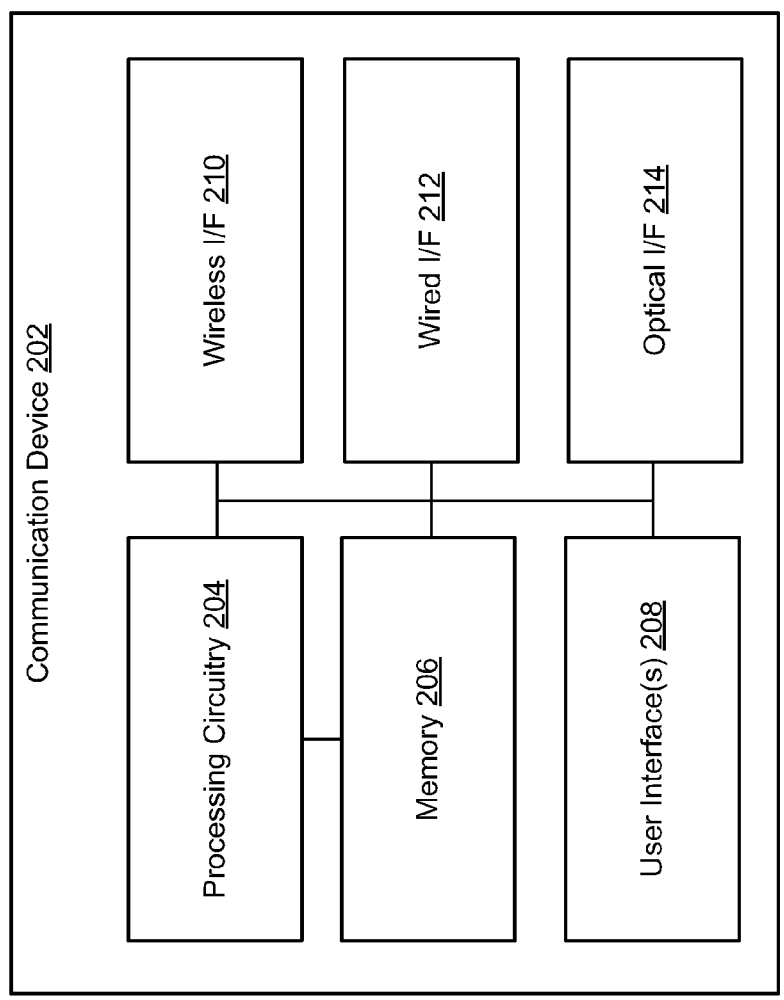
FIG. 2 is a block diagram illustrating components of a communication device constructed and operating according to one more embodiments of the present disclosure.

FIG. 2 is a block diagram illustrating components of a communication device constructed and operating according to one more embodiments of the present disclosure. The communication device 202 includes processing circuitry 204, memory 206, one or more user interfaces 208, and a wireless interface 210 and includes one or more of a wired interface 212 and an optical interface 214. The communication device may be one of the communication devices illustrated in FIG. 1.

The processing circuitry 204 may be one or more of a microprocessor, a digital signal processor, application specific processing circuitry, and/or other circuitry capable of executing logic operations based upon pre-programmed instructions or the execution of software instructions. The memory 206 may be dynamic RAM, static RAM, flash RAM, ROM, programmable ROM, magnetic storage, optical storage or other storage that is capable of storing instructions and data. The stored data may be audio data, video data, user data, software instructions, configuration data, or other data. The user interface 208 supports one or more of a video monitor, a keyboard, an audio interface, or other user interface device.

The wireless interface 210 supports one or more of cellular communications, WLAN communications, WPAN communications, WWAN communications, 60 GHz communications, NFC communications, and/or other wireless communications. These wireless communications are standardized in most embodiments and proprietary in other embodiments. The wired interface 212 supports wired communications, which may be LAN communications, WAN communications, cable network communications, direct data link communications, or other wired communications. The optical interface 214 supports optical communications, which are standardized in some embodiments and proprietary in other embodiments.

Multiple of the components 204, 206, 208, 210, 212, and 214 of the communication device may be constructed on a single integrated circuit die. It is fairly common to form all communication components, e.g., wireless interface 210, wired interface 212, and optical interface 214 on a single integrated circuit. When this structure is employed, noise created by some components may affect the operation of other components, which is typically referred to as noise coupling. Noise is often times coupled via a common ground plane of the single integrated circuit to a wireless interface, causing Electro Magnetic Interference (EMI). The wireless interface 210, in many embodiments, services wireless signals having low signal voltage. Thus, in modern cellular applications which employ multiple radios cellular, WLAN, and WPAN standards have very stringent EMI requirements. Of course, noise may also be coupled between integrated circuits mounted on a Printed Circuit Board (PCB) as well, e.g., between one or more of a display, a camera, memory, external connectors, a processor, etc.

The wired interface 212 and the optical interface 214 typically service bit stream communications with which data is conveyed. These bit stream communications may be Serializer/Deserializer (SERDES) communications or optical link communications. With ideal bit stream communications, the bit stream data transitions from logic high to logic low and from logic low to logic high instantaneously. However, because transmit circuitry of the wired interface 212 and optical interface 214 use transistors to create the bit stream, there is delay in transitioning from logic low to logic high and from logic high to logic low. These delays are called rise times (logic low to logic high) and fall times (logic high to logic low).

Most bit stream communications are formed as differential signals. Servicing communications using differential signaling allows a receiver to fairly easily reject common mode noise that is equally applied to each phase of the differential signal. With differential bit stream signaling, during the transition of the bit stream data, one component of the differential signal transitions from logic low to logic high while the other component transitions from logic high to logic low. If these transitions occur at the same rate, common mode noise is minimized. However, with prior differential line drivers, due to their construct, there was a mismatch between rise times and fall times. This mismatch causes common mode noise to be coupled to the ground plane in an integrated circuit, resulting in EMI in wireless interface(s) formed on the same integrated circuit.

Figure 3A:
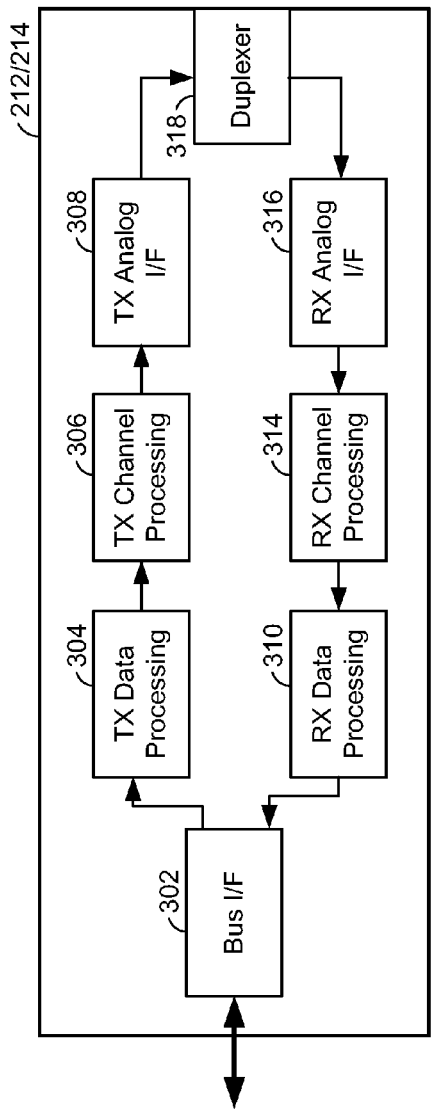
FIG. 3A is a block diagram illustrating a wired interface of a communication device constructed operating according to one or more embodiments of the present disclosure.

FIG. 3A is a block diagram illustrating a wired interface 212 (or optical interface 214) of a communication device constructed operating according to one or more embodiments of the present disclosure. The wired interface 212 includes a bus interface 302 that interfaces with processing circuitry of the communication device. The wired interface includes a transmit path and a receive path. The transmit path includes TX data processing 304 that forms data for transmission. The TX data processing 304 may execute one or more protocol layer functions, e.g., Link and/or PHY layer operations, or a portion thereof. In other constructs the TX data processing 304 may service additional operations as well such as session, transport, and network layer operations. TX channel processing 306 performs PHY layer operations in forming data for transmission. The TX analog interface 308 transitions the data from digital to analog form. Duplexer 318 allows transmit and receive circuitry to interface with a coupled physical media. Receive path components include the duplexer 318, an RX analog interface 316, RX channel processing 314, RX data processing 310 and the bus interface 302. These components perform operations that are complementary to the transmit path operations.

The TX analog interface 308 includes a differential driver constructed and operating according to the present disclosure. As will be described further with reference to FIGS. 4-7, this differential driver provides improved performance in matching rise time to fall time of differential bit stream communications, thus reducing back plane noise and EMI. This improved structure may be used with either wired or optical communications.

Figure 3B:
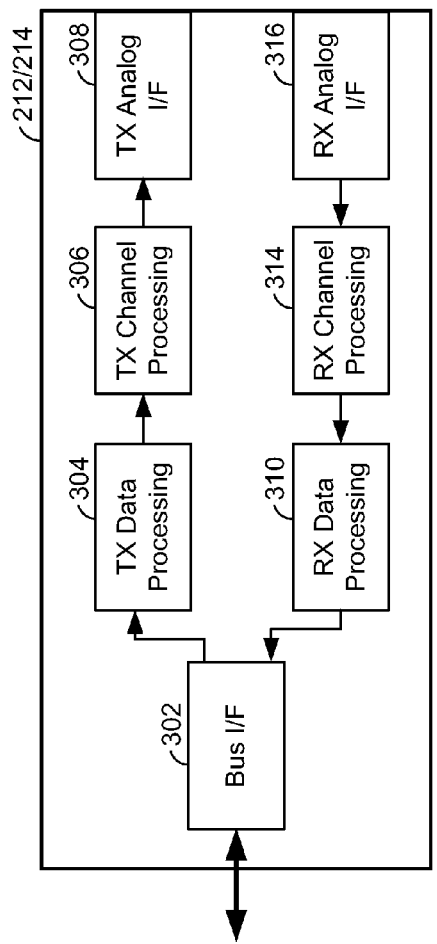
FIG. 3B is a block diagram illustrating a wired interface of a communication device constructed operating according to one or more embodiments of the present disclosure.

FIG. 3B is a block diagram illustrating a wired interface 212 (or optical interface 214) of a communication device constructed operating according to one or more embodiments of the present disclosure. The structure of FIG. 3B is same/similar to the structure of FIG. 3A, except that the TX analog interface 308 and the RX analog interface 316 couple directly to media.

FIG. 4A is a block diagram illustrating an analog interface 308 of a wired interface (or optical interface) of a communication device constructed operating according to one or more embodiments of the present disclosure. The analog interface 308 includes a singled ended to differential conversion block 402, which operates on digital bit stream data. The single ended to differential conversion block 402 produces both positive and negative differential outputs, which may be operated on by Digital to Analog Converters (DACs) 404 and 410, respectively. A positive leg signal 414 is received by a first pre-driver 406 while a negative leg signal 420 is received by a second pre-driver 412. In another embodiment, the output of the singled ended to differential conversion block 402 is provided directly to the first and second pre-drivers 406 and 412, respectively.

According to the present disclosure, the first pre-driver 406 includes a voltage divider configured to produce a first pull up signal 416 and the first pull down signal 418 based upon a positive leg 414 of the differential bit stream signal produced by DAC 404. Further, the second pre-driver 412 is configured to produce a second pull up signal 422 and a second pull down signal 424 based upon a negative leg 420 of the differential bit stream signal produced by DAC 410.

According to one or more embodiments of the present disclosure, the first pull up signal 416 is at a higher voltage than the first pull down signal 418 and the second pull up signal 422 is at a higher voltage than the second pull down signal 424. Differential driver circuitry 408 receives as its input the first pull up signal 416, the first pull down signal 418, the second pull up signal 422, and the second pull down signal 424. One embodiment of the differential driver circuitry 408 will be illustrated in and described further with reference to FIG. 5. The output of the differential driver circuitry 408 are differential signals 426 and 428, which are used to drive data on media, either directly as shown in FIG. 3B or through a duplexer as shown in FIG. 3A.

FIG. 4B is a block diagram illustrating an analog interface 308 of a wired interface (or optical interface) of a communication device constructed operating according to one or more embodiments of the present disclosure. The structure of FIG. 4B is similar/same to that of FIG. 4A except that a DAC 452 is placed prior to the single ended to differential conversion circuitry 454.

Figure 5:
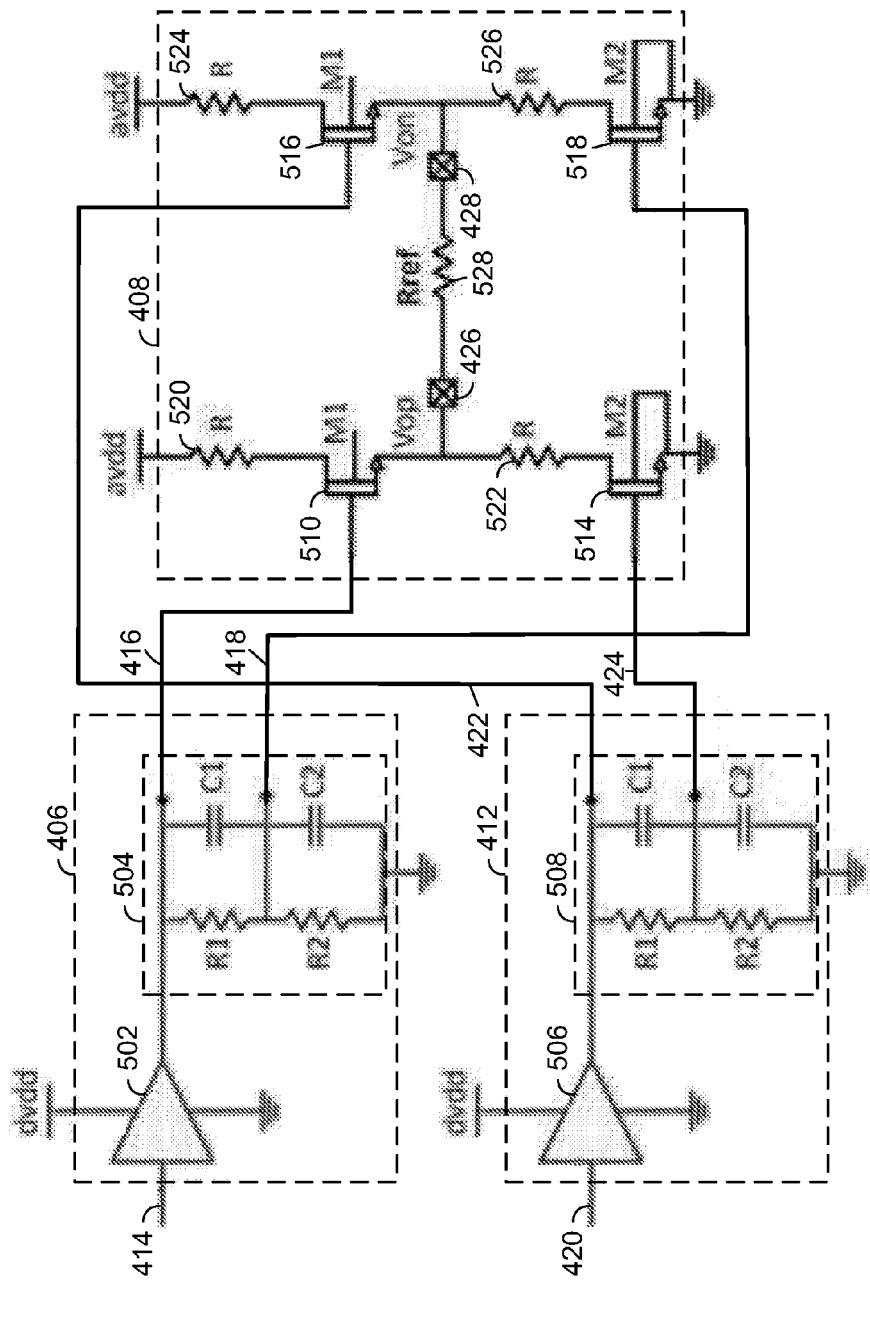
FIG. 5 is a circuit diagram illustrating an embodiment of a differential driver circuit, which forms a portion of an analog interface of a wired interface of a communication device constructed and operating according to the present disclosure.

FIG. 5 is a circuit diagram illustrating an embodiment of a differential driver 500, which forms a portion of an analog interface of a wired interface of a communication device constructed and operating according to the present disclosure. The differential driver 500 includes the first pre-driver 406, the second pre-driver 412, and the differential driver circuitry 408 of FIGS. 4A and 4B. The differential driver circuitry 408 includes a positive leg having a positive leg pull up transistor 510 and a positive leg pull down transistor 514 connected in series between a voltage source and ground. The differential driver circuitry 408 also includes a negative leg having a negative leg pull up transistor 516 and a negative leg pull down transistor 518 connected in series between the voltage source and ground. A differential output signal is produced at positive leg node 426 and negative leg node 428 that are coupled via $R_{ref}$ 528.

The differential driver circuitry 408 includes first resistor 520 coupled between the source voltage and a drain of the positive leg pull up transistor 510 and a second resistor 522 coupled between a source of the positive leg pull up transistor 510 and a drain of the positive leg pull down transistor 514. The differential driver circuitry 408 further includes a third resistor 524 coupled between the source voltage and a drain of the negative leg pull up transistor 516 and a fourth resistor 526 coupled between a source of the negative leg pull up transistor 516 and a drain of the negative leg pull down transistor 518. A drain of the positive leg pull down transistor 514 couples to ground and a drain of the negative leg pull down transistor 518 couples to ground. Further, with this configuration, the positive leg pull up transistor 510 and the positive leg pull down transistor 514 are in a common drain configuration while the negative leg pull up transistor 516 and the negative leg pull down transistor 518 are also in a common drain configuration.

With the configuration of the differential driver circuitry 408 of FIG. 5, the positive leg pull up transistor 510 has a different bias condition than does the positive leg pull down transistor 514. Further, with this configuration, the negative leg pull up transistor 516 and the negative leg pull down transistor 518 have differing bias conditions. The resistance of the transistors 510, 514, 516 and 518 is a significant portion of the resistance of the positive and negative legs. In order to reduce power consumption and to reduce output capacitance, the transistors 510, 514, 516, and 518 cannot be large and operate at high data speeds. With similar sizes, the pull up transistors 510 and 516 transition at differing rates due to their differing bias conditions than do the pull down transistors 514 and 518, coupling common mode noise to the ground plane resulting in EMI.

In order to address these operational difficulties, the first pre-driver 406 and the second pre-driver 412 produce the pull up signals 416 and 422 at relatively higher voltages than they produce the pull down signals 418 and 424. The ratio of the voltages of the pull up signals to the pull down signals causes the pull up transistors 510 and 516 to transition at substantially the same rate as do the pull down transistors 514 and 518. One structure of the first pre-driver 406 and second pre-driver 412 to cause this operation is shown in FIG. 5.

The first pre-driver 406 includes a first driver 502 configured to receive the positive leg signal 414 and a first voltage divider 504 coupled to an output of the first driver 502 and configured to produce the first pull up signal 416 coupled to a gate of the positive leg pull up transistor 510 and the first pull down signal 418 coupled to a gate of the negative leg pull down transistor 518. The second pre-driver 412 includes a second driver 506 configured to receive the negative leg signal 420 and a second voltage divider 508 coupled to an output of the second driver 506 and configured to produce the second pull up signal 422 coupled to a gate of the negative leg pull up transistor 516 and the second pull down signal 424 coupled to a gate of the positive leg pull down transistor 514. In this configuration, the first voltage divider 504 is a first resistor-capacitor circuit and the second voltage divider 508 is a second resistor-capacitor circuit. In operation, the first pull up signal 416 is at a higher voltage than the first pull down signal 418 and the second pull up signal 422 is at a higher voltage than the second pull down signal 424. In order to meet the operational conditions necessary for the pull up transistors 510 and 516 (referred to as $M_1$) to transition at approximately the same rate as the pull down transistors 514 and 518 (referred to as $M_2$), the components of the resistor-capacitor circuits 504 and 508 are selected so that they have transfer functions according to:

$$T.F. = \frac{out2}{out1} = \frac{R2}{R1+R2} \frac{1+sC1R1}{1+sCTRT} \quad \text{equation (1)}$$

where $CT=C1+C2$ and $RT=R1\|R2$

For an all pass transfer function, $R_1C_1=R_2C_2$ and therefore $t_{r1}/t_{f1}=t_{r2}/t_{f2}$. $Out_2$ and $out_1$ are designed to result in $VGS_{M2}=VGS_{M1}$ for the pull up transistors 510 and 516 and pull down transistors 514 and 518. Consistent with this design, pull up transistors 510 and 516 ($M_1$) and pull down transistors 514 and 518 ($M_2$) are designed so that $R_{M1}=R_{M2}$ by forming the transistors with $(Width/Length)_{M2}=(Width/Length)_{M1}$. This design supports high speed data operations at lower power by shrinking $M_1$ and $M_2$ sizes. Further, with this design, $R_1$, $R_2$, $C_1$, and $C_2$ can be programmable for different amplitude and/or common mode voltage values. This design works with low pre-driver supply voltages and scales with technology.

In another configuration of the differential driver 500 of FIG. 5, the resistors 522 and 526 may be coupled to ground with the pull down transistors 514 and 518 coupled directly to the pull transistors 510 and 516, respectively. In still other configurations, the differential driver 500 may include other differential amplifier configurations and remain within the scope of the claims of the present disclosure. Further, the teachings of the present disclosure may also be applied to single ended amplifiers as well.

Figure 6:
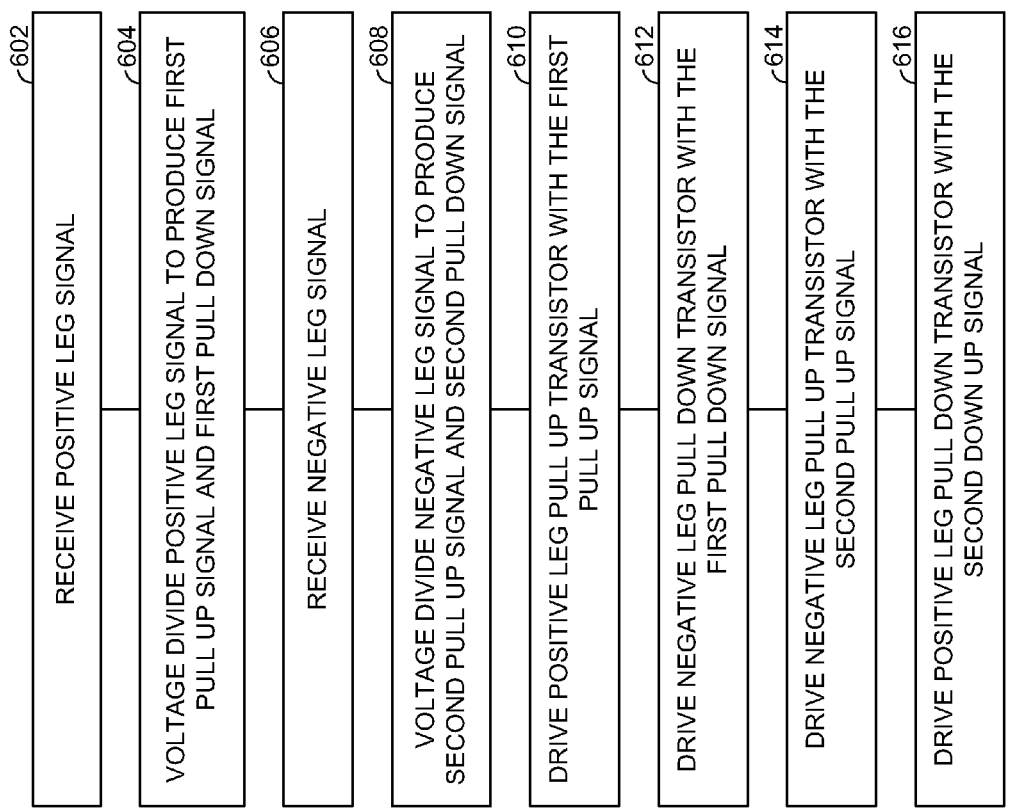
FIG. 6 is a flow chart illustrating operation of a differential driver circuit according to the present disclosure.

FIG. 6 is a flow chart illustrating operation 600 of a differential driver according to the present disclosure. Operation commences with the differential driver receiving a positive leg signal (Step 602). Operation continues with voltage dividing the positive leg signal to produce a first pull up signal and a first pull down signal, the first pull up signal at a higher voltage than the first pull down signal (Step 604). Then, operation includes receiving a negative leg signal (Step 606) and voltage dividing the negative leg signal to produce a second pull up signal and a second pull down signal, the second pull up signal at a higher voltage than the second pull down signal (Step 608). Then, operation includes driving a positive leg pull up transistor of the differential driver with the first pull up signal (Step 610) and driving a negative leg pull down transistor of the differential driver with the first pull down signal (Step 612). Operation concludes with driving a negative leg pull up transistor of the differential driver with the second pull up signal (Step 614) and driving a positive leg pull down transistor of the differential driver with the second pull down signal (Step 616).

Figure 7:
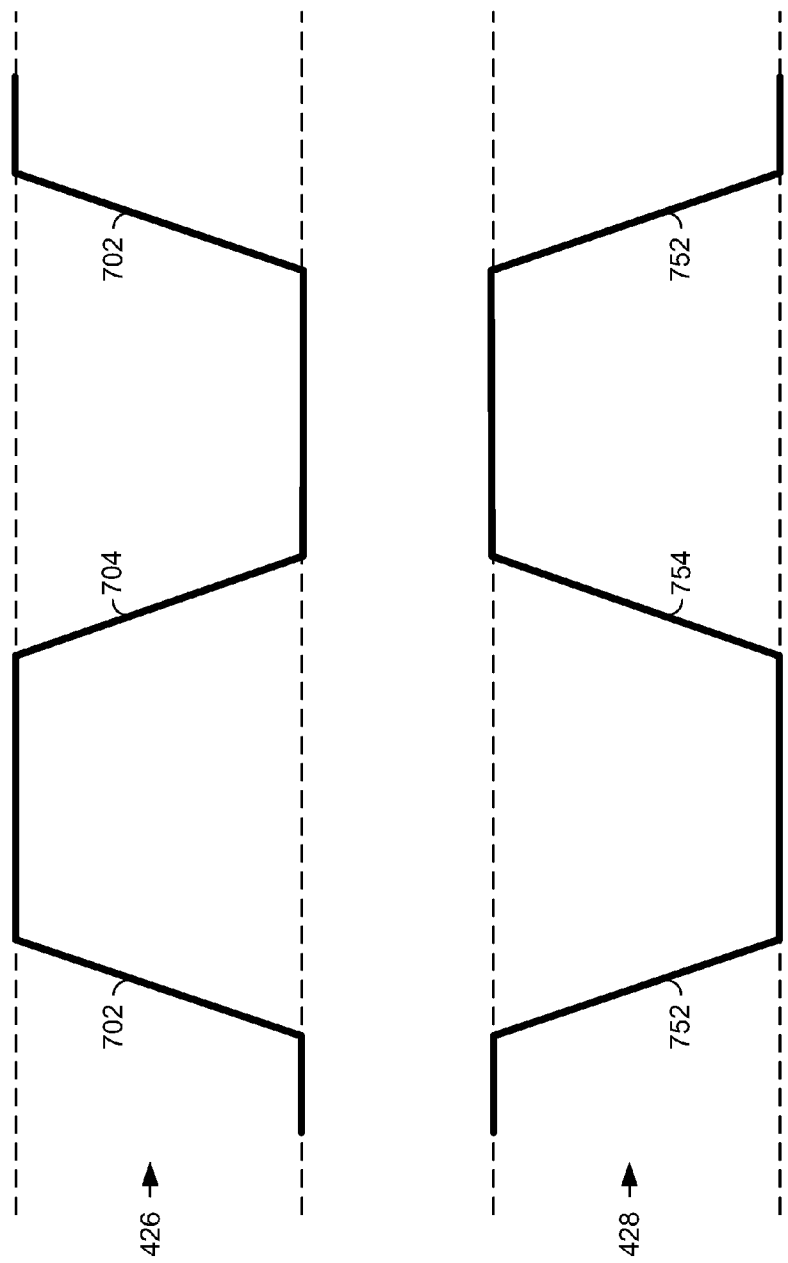
FIG. 7 is a signal diagram illustrating a differential bit stream signal formed according to the structure and/or operations of the present disclosure.

FIG. 7 is a signal diagram illustrating a differential bit stream signal constructed according to the structure and/or operations of the present disclosure. This differential bit stream signal is produced at the outputs 426 and 428 of the differential driver circuitry 408 of FIGS. 4A and/or 4B and/or at nodes 426 and 428 of the differential driver circuitry 408 shown in FIG. 5. The positive output 426 rises at 702 and falls at 704. Further, the negative output 428 falls at 752 and rises at 754. Note that the slope and transition time of the positive output 426 when rising at 702 corresponds closely to the negative of the slope and of the transition time of the negative output 428 when falling at 752. Likewise, the slope and transition time of the positive output 426 when falling 704 corresponds closely to the negative slope and transition time of the negative output 428 when rising 754. Such favorable comparison of the positive 426 and negative 428 outputs reduces backplane noise and maintains signal integrity.

The present disclosure has been described, at least in part, in terms of one or more embodiments. An embodiment of the present disclosure is used herein to illustrate the present disclosure, an aspect thereof, a feature thereof, a concept thereof, and/or an example thereof. A physical embodiment of an apparatus, an article of manufacture, a machine, and/or of a process that embodies the present disclosure may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The present disclosure has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed disclosure. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A differential driver circuit comprising:
  a positive leg having a positive leg pull up transistor and a positive leg pull down transistor connected in series between a voltage source and ground;
  a negative leg having a negative leg pull up transistor and a negative leg pull down transistor connected in series between the voltage source and ground;
  a first pre-driver having:
    a first driver configured to receive a positive leg signal; and
    a first voltage divider coupled to an output of the first driver and configured to produce a first pull up signal coupled to a gate of the positive leg pull up transistor and a first pull down signal coupled to a gate of the negative leg pull down transistor; and a second pre-driver having:
   a second driver configured to receive a negative leg signal; and
   a second voltage divider coupled to an output of the second driver and configured to produce a second pull up signal coupled to a gate of the negative leg pull up transistor and a second pull down signal coupled to a gate of the positive leg pull down transistor.

2. The differential driver circuit of claim 1, further comprising:
   a first resistor coupled between the source voltage and a drain of the positive leg pull up transistor;
   a second resistor coupled between a source of the positive leg pull up transistor and a drain of the positive leg pull down transistor;
   a third resistor coupled between the source voltage and a drain of the negative leg pull up transistor; and
   a fourth resistor coupled between a source of the negative leg pull up transistor and a drain of the negative leg pull down transistor.

3. The differential driver circuit of claim 1, wherein:
   a drain of the positive leg pull down transistor couples to ground; and
   a drain of the negative leg pull down transistor couples to ground.

4. The differential driver circuit of claim 1, wherein:
   the positive leg pull up transistor and the positive leg pull down transistor are in a common drain configuration; and
   the negative leg pull up transistor and the negative leg pull down transistor are in a common drain configuration.

5. The differential driver circuit of claim 1, wherein, during operation:
   the first pull up signal is at a higher voltage than the first pull down signal; and
   the second pull up signal is at a higher voltage than the second pull down signal.

6. The differential driver circuit of claim 1, wherein:
   the first voltage divider comprises a first resistor-capacitor circuit; and
   the second voltage divider comprises a second resistor-capacitor circuit.

7. The differential driver circuit of claim 1, wherein the differential driver circuit drives a differential signal on a Serializer/Deserializer (SERDES) link.

8. The differential driver circuit of claim 1, wherein the differential driver circuit drives a differential signal on an optical link.

9. A differential driver circuit comprising:
   a differential driver configured to drive an output signal based upon a positive leg pull up signal, a positive leg pull down signal, a negative leg pull up signal, and a negative leg pull down signal;
   a first pre-driver having:
      a first driver configured to receive a positive leg signal; and
      a first voltage divider coupled to an output of the first driver and configured to produce the positive leg pull up signal and the negative leg pull down signal; and
   a second pre-driver having:
      a second driver configured to receive a negative leg signal; and
      a second voltage divider coupled to an output of the second driver and configured to produce the negative leg pull up signal and the positive leg pull down signal.

10. The differential driver circuit of claim 9, wherein the differential driver comprises:
   a positive leg having a positive leg pull up transistor and a positive leg pull down transistor connected in series between a voltage source and ground; and
   a negative leg having a negative leg pull up transistor and a negative leg pull down transistor connected in series between the voltage source and ground.

11. The differential driver circuit of claim 10, wherein:
   a drain of the positive leg pull down transistor couples to ground; and
   a drain of the negative leg pull down transistor couples to ground.

12. The differential driver circuit of claim 10, wherein:
   the positive leg pull up transistor and the positive leg pull down transistor are in a common drain configuration; and
   the negative leg pull up transistor and the negative leg pull down transistor are in a common drain configuration.

13. The differential driver circuit of claim 9, wherein, during operation:
   the positive leg pull up signal is at a higher voltage than the negative leg pull down signal; and
   the positive leg pull up signal is at a higher voltage than the negative leg pull down signal.

14. The differential driver circuit of claim 9, wherein:
   the first voltage divider comprises a first resistor-capacitor circuit; and
   the second voltage divider comprises a second resistor-capacitor circuit.

15. The differential driver circuit of claim 9, wherein the differential driver drives a differential signal on a Serializer/Deserializer (SERDES) link.

16. The differential driver circuit of claim 9, wherein the differential driver drives a differential signal on an optical link.

17. A method for creating a differential signal comprising:
   receiving a positive leg signal;
   voltage dividing the positive leg signal to produce a first pull up signal and a first pull down signal, the first pull up signal at a higher voltage than the first pull down signal;
   receiving a negative leg signal;
   voltage dividing the negative leg signal to produce a second pull up signal and a second pull down signal, the second pull up signal at a higher voltage than the second pull down signal;
   driving a positive leg pull up transistor with the first pull up signal;
   driving a negative leg pull down transistor with the first pull down signal;
   driving a negative leg pull up transistor with the second pull up signal; and
   driving a positive leg pull down transistor with the second pull down signal.

18. The method of claim 17, wherein the differential signal comprises a bit stream signal.

19. The method of claim 18, wherein the differential signal comprises a Serializer/Deserializer (SERDES) link signal.

20. The method of claim 18, wherein the differential signal comprises an optical link signal.

* * * * *